United States Patent [19]
Jiang et al.

[11] Patent Number: 5,742,630
[45] Date of Patent: Apr. 21, 1998

US005742630A

[54] VCSEL WITH INTEGRATED PIN DIODE

[75] Inventors: Wenbin Jiang, Phoenix; Chan-Long Shieh, Paradise Valley; Michael S. Lebby, Apache Junction, all of Ariz.

[73] Assignee: Motorola, Inc., Schaumburg, Ill.

[21] Appl. No.: 672,731

[22] Filed: Jul. 1, 1996

[51] Int. Cl.[6] .................................................. H01S 3/19
[52] U.S. Cl. ............................. 372/50; 372/45; 372/96
[58] Field of Search ............................ 372/96, 50, 44, 372/45, 46

[56] References Cited

U.S. PATENT DOCUMENTS 5,136,603  8/1992  Hasnain et al. .................... 372/50

*Primary Examiner*—James W. Davie
*Attorney, Agent, or Firm*—Eugene A. Parsons

[57] ABSTRACT

A VCSEL (113) having first and second stacks of DBRs (120, 116) and an active region sandwiched therebetween (118) is formed. A PIN photo-detector is integrated onto the VCSEL by positioning it on the second stack in the light path. The PIN photo detector includes a first doped region (104), a second undoped (intrinsic) region (106), and a third doped region (108). A first conductive layer (134) is provided in contact with the second stack and the first region and a second conductive layer is provided in contact with the third region.

15 Claims, 1 Drawing Sheet

VCSEL WITH INTEGRATED PIN DIODE

FIELD OF THE INVENTION

This invention relates, in general, to optical devices and, more particularly, to integrated light emitting devices and photodetectors.

BACKGROUND OF THE INVENTION

Automatic power control (APC) of light emitting devices allows for a constant and a consistent output from these devices. Generally, automatic power control of edge emitting laser devices is easily achieved because edge emitting devices emit light from two ends. Thus, enabling one of the light emitting ends to be used to measure the power output, which is subsequently use to adjust the power input to the edge emitting device, thereby adjusting the power output.

However, automatic power control of a vertical cavity surface emitting laser (VCSEL) is a difficult task because the VCSEL generally emits light from only a single surface, thus making measurement of the output and subsequent adjustment thereof a difficult task. Conventionally, in order to accomplish this task, several optical devices, such as photodiodes, mirrors, beam splitters, and the like are positioned manually in the optical path of the emission from the VCSEL. With the optical devices being positioned manually, several problems or disadvantages result, such as a high cost of manufacture, a lack of repeatability, and poor quality control, thus prohibiting high volume manufacturing.

It can be readily seen that conventional APC of VCSELs has several disadvantages and problems, thus not enabling their manufacture in volume manufacturing applications. Therefore, an integrated article and method for making same that simplifies the fabrication process, reduces cost, and improves reliability would be highly desirable.

It is a purpose of the present invention to provide a new and improved integrated VCSEL and photodetector.

It is another purpose of the present invention to provide a new and improved integrated VCSEL and photodetector which is simple and relatively inexpensive to manufacture.

It is still another purpose of the present invention to provide a new and improved integrated VCSEL and photodetector which are integrated with a minimum of labor and cost.

It is a further purpose of the present invention to provide a new and improved integrated VCSEL and photodetector which can be utilized to control the output of the VCSEL.

SUMMARY OF THE INVENTION

The above problems and others are at least partially solved and the above purposes and others are realized in a vertical cavity surface emitting laser with an integrated PIN photodiode. The vertical cavity surface emitting laser includes a substrate with a first surface, a first stack of distributed Bragg reflectors disposed on the first surface of the substrate, an active area disposed on the first stack of distributed Bragg reflectors, and a second stack of distributed Bragg reflectors disposed on the active area so as to define an optical pathway through which light is generated and passes. The vertical cavity surface emitting laser further includes first and second electrical contacts coupled to the first and second stacks respectively for supplying operating power thereto. The PIN diode includes a first region of a first doped material disposed in the optical pathway and coupled to the second electrical contact, a second region of an undoped material disposed on the first region and in the optical pathway, a third region of a second doped material disposed on the second region and in the optical pathway, and a third electrical contact coupled to the third region. The first, second and third regions include p-type material, intrinsic material, and n-type material which define a PIN photodetector in the optical pathway and integrated with the vertical cavity surface emitting laser.

BRIEF DESCRIPTION OF THE DRAWINGS

Referring to the drawings.

DESCRIPTION OF THE PREFERRED EMBODIMENTS

Figure 1:
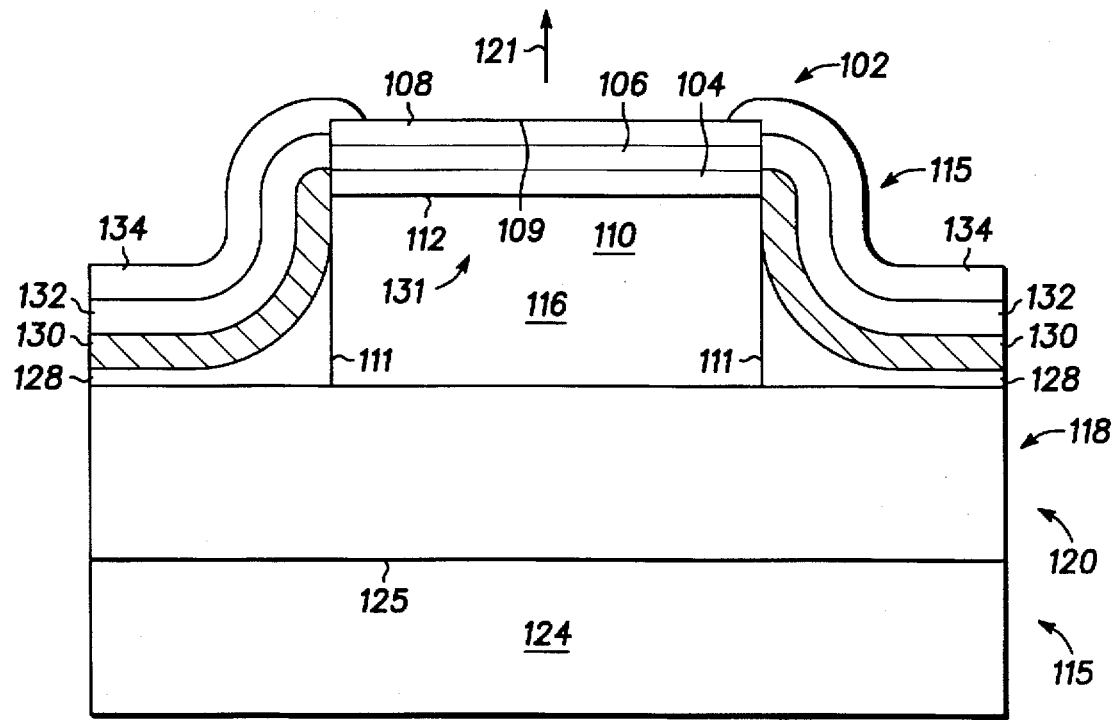
FIG. 1 is a simplified sectional view of a ridge VCSEL with a pin photodiode in accordance with the present invention.
Figure 2:
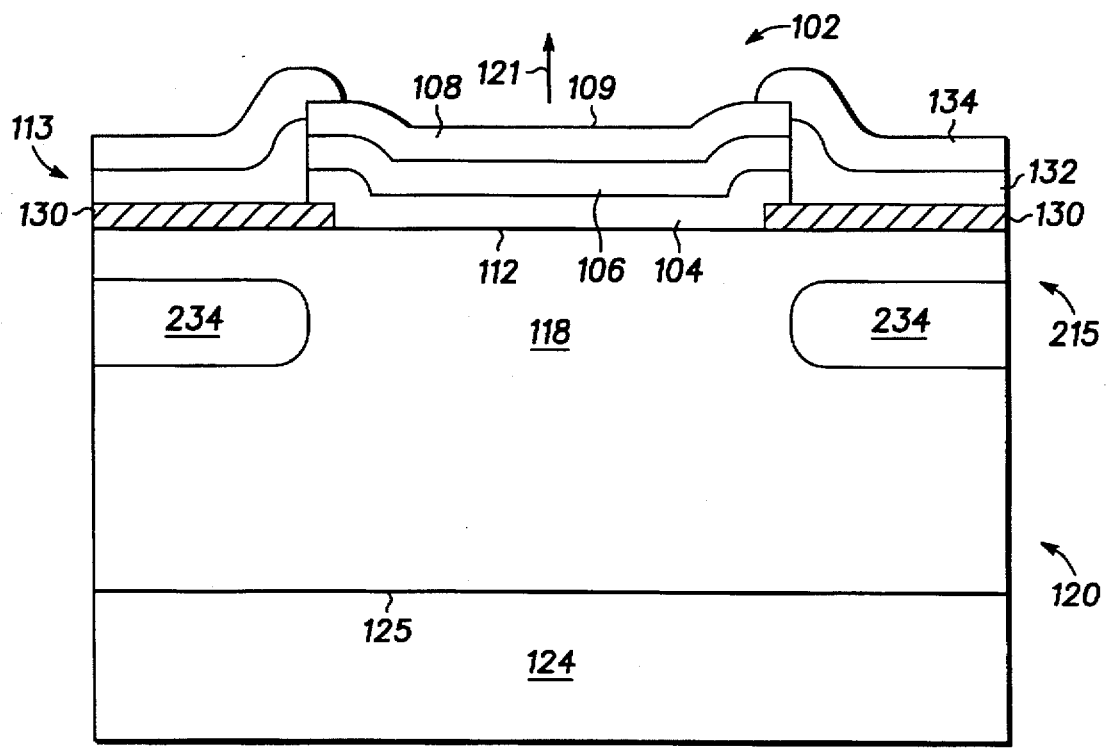
FIG. 2 is a simplified sectional view of a planar VCSEL with a pin photodiode in accordance with the present invention.

FIGS. 1 and 2 illustrate an integrated device 100 that includes a PIN photodiode 102 for measuring light, represented by an arrow 121, from a VCSEL. It should be noted that in FIG. 1 the VCSEL is represented by a ridge VCSEL 115 and in FIG. 2 the VCSEL is represented by a planar VCSEL 215. PIN photodiode 102 includes a first region 104, a second region 106, and a third region 108 having a surface 109. As shown in FIGS. 1 and 2, both ridge VCSEL 115 and planar VCSEL 215 include a substrate 124 having a surface 125, a first stack 120 of distributed Bragg reflectors (DBR), an active region 118, a second stack 116 of distributed Bragg reflectors, a conductive layer 130, and an insulative layer 132. As illustrated in FIG. 1, ridge VCSEL 115 is shown to include a ridge 110 defined by sidewalls 111 and a surface 112, utilized to define a light and current path and to contain the current flowing through VCSEL 115. FIG. 2 shows that planar VCSEL 215 includes a damaged region 234 utilized to contain the current flowing in VCSEL 125 and, thereby, define a light path.

It should be understood that FIGS. 1 and 2 are simplified illustrations and that many elements have been purposely omitted or simplified to more clearly illustrate the present invention. Further, it should be noted that FIGS. 1 and 2 are sectional views, thereby illustrating that the integrated device 100 extends into an out of the figure as well as to either side. It will be understood that integrated device 100 represents a single integrated device or an array of integrated devices.

Generally, as shown in FIGS. 1 and 2, both ridge VCSEL 115 and planar VCSEL 215 are made by any well-known method or process in the art. However, for the purposes of orienting the reader, a brief description of materials and methods is provided hereinbelow. Briefly, both ridge VCSEL 115 and planar VCSEL 215 are fabricated on any suitable semiconductor substrate, such as gallium arsenide, indium phosphite, or the like where the semiconductor substrate provides surface 125. The first stack 120 of distributed Bragg reflectors, active area 118, and the second stack 116 of distributed Bragg reflectors are epitaxially deposited on surface 125 by any suitable method, such as molecular beam epitaxy (MBE), meto-organic chemical vapor deposition (MOCVD), or the like.

Referring now to FIG. 1, in the present invention, with the epitaxial depositions being completed, second stack 116 of distributed Bragg reflectors is patterned to form ridge 110. Generally, ridge 110 is made by any suitable well-known method in the art, such as photolithography, etching, lift-off, any combination thereof, or the like. By defining ridge 110 in second stack 116 of distributed Bragg reflectors, an optical path is defined in second stack 116 that reflects and guides light formed in active region or area 118.

Referring now to FIG. 2, once the epitaxial depositions are complete, an ion implant mask (not shown) is formed on second stack 116 of distributed Bragg reflectors. The ion implant mask is fabricated by any suitable well-known method in the art such as photolithography, deposition, etching, any combination thereof, or the like. The ion implant mask provides openings which expose portions of second stack 116 of distributed Bragg reflectors while covering or protecting other unexposed portions of second stack 116. Typically, the ion implant mask is shaped in a dot pattern, i.e., islands of the ion implant mask are placed on second stack 116. Once the ion implant mask is formed, second stack 116 is ion implanted by any suitable well-known method in the art. Generally, ion implantation injects ions through the exposed surface of second stack 116, while the ion implant mask protects and does not allow the ions to penetrate into the unexposed surface of second stack 116. When the ions pass through the exposed surface of second stack 116 and come to rest in second stack 116, they cause damage in the crystal lattice structure resulting in high resistivity damaged areas 234. Because damaged areas 234 do not conduct current as readily as where there is no damage, current is confined to areas where there is no damage.

Once ridge VCSEL 115 or planar VCSEL 215 have been formed, a series of depositions and patterning steps are performed to fabricate layers 128, 130, 132, 134, and regions 104, 106, and 108. Generally, the depositions are performed by any suitable well-known method in the art such as chemical vapor deposition (CVD), plasma enhanced chemical vapor deposition (PECVD), sputtering, or the like. In addition, the patterning steps also are performed by any suitable well-known methods or processes in the art, such as photolithography, lift-off, etching, or combination thereof.

Referring to FIG. 1, layer 128 is formed of any suitable dielectric material, such as nitride, oxynitride, oxide, or the like. Layer 128 is deposited on ridge 110 and first stack 120 of distributed Bragg reflectors, thereby overlying structures previously described. Layer 128 is then patterned to expose a surface 112 of ridge 110 while the remaining portions of layer 128 passivate or insulate structures where layer 128 has not been removed as shown in FIG. 1.

Referring to both FIGS. 1 and 2, conductive layer 130 is then deposited on substrate 124. Conductive layer 130 is made of any suitable electrically conductive material or alloy, such as titanium tungsten, titanium gold, gold, aluminum, silver, or the like. Conductive layer 130 is then subsequently patterned to expose surface 112 of second stack 116 of distributed Bragg reflectors, thus conductive layer 130 provides both a light opening which exposes surface 112, as well as an electrical contact which provides an external electrical contact to the second stack 116. Another electrical contact is provided on substrate 124 so as to be coupled to first stack 120 of distributed Bragg mirrors. As will be understood by those skilled in the art, the contact may be disposed on either the top or the bottom surface of substrate 124.

Regions 104, 106, and 108 typically are made to correspond to a p-doped region, an undoped region or an intrinsic region, and an n-doped region, respectively, thereby forming a PIN photodiode 102. PIN photodiode 102 captures and measures a small percentage (approximately 10 percent) of the light (arrow 121) being emitted from VCSEL 113, thereby allowing the power output, i.e., light output of VCSEL 113, to be measured and subsequently adjusted to a desired level.

Regions 104, 106, and 108 are made of any suitable material; however, in a preferred embodiment of the present invention, regions 104, 106, and 108 are made of a material having a silicon component, such as silicon, hydrogenated silicon, hydrogenated amorphous silicon (a-Si:H), or the like. In a preferred embodiment of the present invention, regions 104, 106, and 108 are form by depositing on substrate 124 a first layer of amorphous silicon which is p-type doped, a second layer of amorphous silicon which is undoped, and a third layer of amorphous silicon which is n-type doped, thereby providing the necessary layers for fabricating PIN photodiode 102. It should be understood that any suitable p-type doping or n-type doping, such as phosphorous and boron, respectively, can be used in doping of the first and third layers. It should also be noted that doping levels for PIN photodiodes are well known and need not be discussed here. Additionally, it should be understood that layer 104 with the p-type dopant and layer 108 having the n-type dopant can be reversed.

Generally, the thickness of regions 104, 106, and 108 are as thin as possible, thereby allowing a majority of light 121 to emanate from PIN photodiode 102. By way of example, assuming a ten (10) percent adsorption of the generated light (arrow 121) and a coefficient of absorption of 1000 cm$^{-1}$, the total thickness will be approximately 1 micron (10,000 Angstroms) with thickness of the first layer being 100 nm (1,000 Angstroms), the thickness of the second layer being 800 nm (8,000 Angstroms), and the thickness of the third layer being 100 nm (1,000 Angstroms).

However, it should be understood that the thickness of regions 104, 106, and 108 are dependent on a wavelength of the generated light. While the above thicknesses and ranges are useful for generated light having a wavelength from 650 nanometer (nm) to 730 nm, generated light having a wavelength from 780 nm to 850 nm may require a suitable material that enhances absorption at these wavelengths. By way of example, absorption can be increased at these wavelengths by using an amorphous silicon germanium alloy, or the like.

The first, second, and third layers of partially fabricated PIN photodiode 102 are then patterned and etched by any suitable method well known in the art to form regions 104, 106, and 108. Typically, photolithography is used to define the pattern with the pattern being transferred by either a wet etch, i.e., Nitric acid ($HNO_3$) plus Hydrofluoric acid (HF) solution or dry etch, i.e., a gas plasma containing fluorine ($CHF_3$). It should be understood that when selecting an etch method care should be used so as to provide the highest selectivity as reasonably possible. Once the first second and third layers are etched, conductive layer 130 provides electrical coupling to second stack 116 of distributed Bragg reflectors and to region 104 of photodiode 102.

With the first, second, and third layers properly etched, insulative layer 132 is deposited on substrate 124. Layer 132 is made of any suitable dielectric material such as nitride, oxynitride, oxide, or the like. Insulative layer 132 is then patterned and etched to expose surface 109 of region 108. Remaining portions of insulative layer 132 passivate or insulate underlying structures.

Conductive layer 134 is deposited on ridge 110 and insulative layer 132. Conductive layer 134 is made of any suitable conductive material or alloys, such as titanium tungsten, titanium gold, gold, aluminum, silver, or the like. Conductive layer 134 is then patterned and etched to expose surface 109 of region 108 while also providing a second electrical contact for PIN photodiode 102.

In a specific example, a layer of undoped amorphous silicon (layer 106) with a bandgap $E_g$ (wavelength $\lambda g$) is sandwiched between a layer of p-doped amorphous silicon (layer 104) and a layer of n-doped amorphous silicon (layer 108) to form PIN photo detector 102. The central undoped amorphous silicon thickness is around 1 μm. The p-doped and the n-doped amorphous silicon thicknesses are about 50 nm to 100 nm each for electrical contact purposes. The p-doped silicon is directly deposited on top of the p-DBR of VCSELs 115 and/or 215, so that the p-contact of the VCSEL can be shared by the PIN photo detector. If the top DBR (stack 116) of the VCSEL is n-doped, then the n-doped amorphous silicon will be directly deposited on top of the n-DBR, and the n-contact of the VCSEL will be shared by the PIN photo detector. The PIN photo detector can be either reverse biased, or without bias, if the PIN photo detector speed is not a concern. When light with a wavelength shorter than $\lambda g$ is emitted from the VCSEL, it will transmit through the integrated PIN photo detector a portion of the light absorbed by the detector. The thickness of the PIN photo detector is designed to absorb about 10% of the incident light with 90% of the light transmitted. The photons absorbed in the undoped amorphous silicon region create electron-hole pairs. Due to either the built-in field or the external field if the PIN photo detector is reverse biased, the electrons will drift toward the n-contact region and the holes will drift toward the p-contact region. If there is a closed electrical loop between the n-contact and the p-contact, current flow can be detected. Depending on the magnitude of the current flow, which is proportional to the incident laser intensity, a feedback loop can be established to control the VCSEL injection current for VCSEL auto power control (APC).

By now it should be appreciated that a novel VCSEL with integrated PIN photodiode and method for fabrication have been disclosed. The VCSEL is integrated with a PIN photodiode, thereby enabling the light output of the VCSEL to be easily monitored and subsequently adjusted to a desired level. Additionally, since integrated VCSEL and PIN photo detector are fabricated as one device, the integrated device is highly manufacturable, thus reducing cost and allowing significant improvements in reliability and quality.

While we have shown and described specific embodiments of the present invention, further modifications and improvements will occur to those skilled in the art. We desire it to be understood, therefore, that this invention is not limited to the particular forms shown and we intend in the appended claims to cover all modification that do not depart from the spirit and scope of this invention.

What is claimed is:

1. A vertical cavity surface emitting laser with integrated PIN photodiode comprising:

a vertical cavity surface emitting laser having a substrate with a first surface, a first stack of distributed Bragg reflectors disposed on the first surface of the substrate, an active area disposed on the first stack of distributed Bragg reflectors, a second stack of distributed Bragg reflectors disposed on the active area so as to define an optical pathway through which light is generated and passes, the vertical cavity surface emitting laser further including first and second electrical contacts coupled to the first and second stacks respectively for supplying operating power thereto;

a first region of a first doped material disposed on the second stack of distributed Bragg reflectors in the optical pathway and coupled to the second electrical contact, the first region of the first doped material being lattice unmatched to the second stack of distributed Bragg reflectors;

a second region of an undoped material disposed on the first region and in the optical pathway;

a third region of a second doped material disposed on the second region and in the optical pathway; and a third electrical contact coupled to the third region, the first, second and third regions defining a PIN photodetector in the optical pathway and integrated with the vertical cavity surface emitting laser.

2. A vertical cavity surface emitting laser with integrated PIN photodiode as claimed in claim 1 wherein the first doped material includes silicon.

3. A vertical cavity surface emitting laser with integrated PIN photodiode as claimed in claim 2 wherein the first doped material is doped with phosphorous.

4. A vertical cavity surface emitting laser with integrated PIN photodiode as claimed in claim 1 wherein the undoped material is made of silicon.

5. A VCSEL with integrated PIN photodiode as claimed in claim 1 wherein the second doped material includes silicon.

6. A vertical cavity surface emitting laser with integrated PIN photodiode as claimed in claim 5 wherein the second doped material is doped with boron.

7. A vertical cavity surface emitting laser with integrated PIN photodiode as claimed in claim 5 wherein the first doped material is doped with phosphorous and wherein the second doped material is doped with boron.

8. A vertical cavity surface emitting laser with integrated PIN photodiode as claimed in claim 2 wherein the first doped material includes amorphous silicon.

9. A vertical cavity surface emitting laser with integrated PIN photodiode comprising:

a vertical cavity surface emitting laser having a substrate with a first surface, a first stack of distributed Bragg reflectors disposed on the first surface of the substrate, an active area disposed on the first stack of distributed Bragg reflectors, a second stack of distributed Bragg reflectors disposed on the active area so as to define an optical pathway through which light is generated and passes, the vertical cavity surface emitting laser further including a first electrical contact coupled to the first stack for supplying operating power thereto;

a first conductive layer disposed on the second stack of distributed Bragg reflectors and in contact therewith so as to form a second electrical contact to the vertical cavity surface emitting laser;

a first region of a first doped material disposed in contact with the first conductive layer and on the second stack of distributed Bragg reflectors in the optical pathway, thereby electrically coupling the first region and the second stack of distributed Bragg reflectors to the first conductive layer, the first region of the first doped material being lattice unmatched to the second stack of distributed Bragg reflectors;

a second region of an undoped material disposed on the first region and in the optical pathway;

a third region of second doped material disposed on the second region and in the optical pathway; and a second conductive layer electrically coupled to the third region, thereby defining a third electrical contact.

10. A vertical cavity surface emitting laser with integrated PIN photodiode as claimed in claim 9 wherein the first doped material includes silicon.

11. A vertical cavity surface emitting laser with integrated PIN photodiode as claimed in claim 10 wherein the first doped material is doped with phosphorous.

12. A vertical cavity surface emitting laser with integrated PIN photodiode as claimed in claim 9 wherein the undoped material includes silicon.

13. A vertical cavity surface emitting laser with integrated PIN photodiode as claimed in claim 9 wherein the second doped material includes silicon.

14. A vertical cavity surface emitting laser with integrated PIN photodiode as claimed in claim 13 wherein the second doped material is doped with boron.

15. A vertical cavity surface emitting laser with integrated PIN photodiode as claimed in claim 10 wherein the first doped material includes amorphous silicon.

* * * * *